United States Patent [19]

Siebold et al.

[11] Patent Number: 5,079,503
[45] Date of Patent: Jan. 7, 1992

[54] MAGNETIC RESONANCE IMAGING APPARATUS AND METHOD FOR OPERATING SAME

[75] Inventors: Horst Siebold; Wolfgang Frie, both of Erlangen, Fed. Rep. of Germany

[73] Assignee: Siemens Aktiengesellschaft, Munich, Fed. Rep. of Germany

[21] Appl. No.: 498,391

[22] Filed: Mar. 26, 1990

[30] Foreign Application Priority Data

Mar. 28, 1989 [DE] Fed. Rep. of Germany ....... 3910058

[51] Int. Cl.$^5$ .............................................. G01R 33/20
[52] U.S. Cl. ..................................................... 324/309
[58] Field of Search ............... 324/300, 307, 309, 318, 324/322; 128/653 A

[56] References Cited

U.S. PATENT DOCUMENTS

| | | | |
|---|---|---|---|
| 4,509,015 | 4/1985 | Ordidge et al. | 324/309 |
| 4,628,264 | 12/1986 | Rzedzian | 324/322 |
| 4,920,318 | 4/1990 | Misic et al. | 324/318 |
| 4,926,125 | 5/1990 | Roemer | 324/318 |

FOREIGN PATENT DOCUMENTS

| | | |
|---|---|---|
| 3415041 | 10/1984 | Fed. Rep. of Germany . |
| 3643577 | 6/1988 | Fed. Rep. of Germany . |
| 3808995 | 9/1988 | Fed. Rep. of Germany . |
| WO85/04258 | 9/1985 | PCT Int'l Appl. . |

OTHER PUBLICATIONS

"Whole Body NMR Spiral-Scan Echo Planar Imaging (SEPI) Using Resonant Gradient Coil", Kim et al. Society of Magnetic Resonance in Medicine, 7th Annual Meeting and Exhibition, Aug. 1988 (p. 1013).

"NMR Imaging: Image Recovery Under Magnetic Field with Large Non-Uniformities", Hutchison et al. J. Phys. E: Sci. Instrum. vol. 11, 1978 (pp. 217-221).

"Instrumentation for NMR Spin-Warp Imaging", Johnson et al. J. Phys. E: Sci. Instrum. vol. 15, 1982 (pp. 74-79).

"Biological and Medical Imaging by NMR", Mansfield et al. J. Mag. Res., vol. 29 (1978) pp. 355-373.

*Primary Examiner*—Michael J. Tokar
*Attorney, Agent, or Firm*—Hill, Van Santen, Steadman & Simpson

[57] ABSTRACT

A magnetic resonance imaging apparatus generates tomograms according to the echo planar imaging method (EPI), with at least one of the gradient coils having a resonant circuit allocated thereto which is excited by an amplifier. A capacitor forms a series resonant circuit with the gradient coil, and a controlled gain amplifier which is operated as a current regulator, such as a switched current regulator, is connected to this series resonant circuit. The read-out gradient $G_x$ is switched on at a time $t_0$, the gradient $G_x$ having a transient region $\tau_1$ beginning at $t_0$ and ending at a time $t_2$. The gradient current $I(t)$ is steady in this transient region $\tau_1$, and the integral of the gradient current $I(t)$ over $t_0$ through $t_2$ is zero.

9 Claims, 6 Drawing Sheets

MAGNETIC RESONANCE IMAGING APPARATUS AND METHOD FOR OPERATING SAME

BACKGROUND OF THE INVENTION

1. Field of the Invention

The present invention is directed to a magnetic resonance imaging (MRI) tomography apparatus, also known as a nuclear magnetic resonance (NMR) tomography apparatus, operating according to the echo planar imaging method, wherein the chronological curve of the read-out gradient follows a cosine function. A method of operating such an apparatus is also disclosed.

2. Description of the Prior Art

Magnetic resonance imaging tomography devices are known for examining a subject, such as the human body, based on the phenomenon of nuclear magnetic resonance. These tomography devices include a main or static field magnet which aligns the nuclear spins in the human body, and a RF system for exciting the nuclear spins and for receiving the signals emitted as a result of the excited nuclear spins. Gradient coils are provided which proceed in the direction of the main magnetic field and which generate a magnetic field which changes linearly in this direction. These coils are used for slice selection and for the spatial allocation of the signals in the slice. Further gradient coils are also provided which respectively generate magnetic fields proceeding the direction of the fundamental field, but which change in two directions perpendicular thereto. By exciting these gradient coils, the phase of the signal induced in the RF system following the generation of the main field is influenced in the body region under examination, dependent on the distribution of the nuclear spins. It is thus possible to derive an image of a planar section of the body based on the distribution of the nuclear spins.

When gradient coils are used in a magnetic resonance imaging apparatus for fast pulse sequences, the portion of the higher audio frequencies contained in the spectrum of the pulse sequences increases from about 1 through 10 kHz. To avoid both increased power consumption and field distortions in this range due to the skin effect in solid conductors, stranded or cabled conductors can be used for the turns of the gradient coils. The individual saddles of a coil set for the gradient coils associated with a predetermined spatial coordinate must be connected to each other over optimally short paths and with low inductivity. The respective gradient coils allocated to the field gradients $G_x$ and $G_y$, which are generally fashioned as saddle coils, therefore preferably each consist of a single cabled conductor. These gradient coils can be fashioned as saddle coils consisting of three sub-coils which are arranged in the same cylindrical surface a carrier member. The number of turns of the outer sub-coil relative to the middle sub-coil and relative to the inner sub-coil can increase in a predetermined relationship, such as approximately 1:1:4.

For producing tomograms in a magnetic resonance imaging apparatus according to the echo planar imaging (EPI) method, the image consists of picture elements in the section plane. The measured values are acquired in the Fourier plane, i.e., the Fourier transformation of the image content is measured. The image values in the locus plane are calculated from the measured data in the wave number plane by two Fourier transformations taken in perpendicular directions, such as the x-direction and the y-direction. The selection of the section plane of the body ensues by selective slice excitation with a section selection gradient, and simultaneous RF excitation. The entire data set for an image can be acquired with a single elementary pulse sequence. The phase coding gradient is constant in the read-out region, whereas the read-out gradient oscillates.

In this known method, the desired wave number is a sine function, whereas the read-out gradient proceeds according to a cosine function. The read-out gradient jumps to zero at its maximum amplitude at the start of the echo sequence which is defined by the phase coding gradient. This method is described in the article "Biological and Medical Imaging By NMR," Mansfield et al., Journal of Magnetic Resonance, Volume 29, pages 355-373 (1978), the pulse and field gradient timing diagram for two-dimensional echo planar imaging being shown in FIG. 9 of the article.

A magnetic resonance imaging tomography apparatus is known wherein one of the gradient coils forms a parallel resonant circuit in combination with a capacitor. Amplifiers are provided for charging the capacitor. A thyristor switch is provided for modulating the gradient field, the thyristor switch being connected between the gradient coil and the capacitor, and controlling oscillation in both directions. Echo signals are excited by 180° RF pulses. The current in the resonant circuit is proportional to the gradient field. The current of the gradient coil, however, is higher than the current of the amplifier by the quality factor Q. This quality can be influenced by eddy currents and by temperature changes, and is thus not constant during operation. Moreover, the thyristor switch which controls the oscillation requires a relatively large outlay. Such an apparatus is described in U.S. Pat. No. 4,628,264.

SUMMARY OF THE INVENTION

It is an object of the present invention to simplify and improve the known echo planar imaging method for producing tomograms by the phenomenon of nuclear magnetic resonance. The apparatus and method disclosed herein are based on the perception that the gradient coil cannot be switched in the form of a step (skip) function at the start of the range of measurement $\tau_2$ in which the read-out of the measured values ensues.

In the method and apparatus disclosed herein, a controlled gain amplifier is used in combination with a series resonant circuit for supplying power to relevant gradient coil, so that the read-out gradient can be controlled such that the current in a transient range $\tau_1$, which is the range between the time the read-out gradient is switched on and the beginning of a measuring range $\tau_2$, is steady and the wave number $k_x$ is just zero. This means that the current at the beginning of the measuring range $\tau_2$ will also be steady. In this embodiment having a series resonant circuit which includes the gradient coil, the inductive voltages at the coil, which are on the order of magnitude of a few kilovolts, are compensated by the capacitors in the resonant mode of the resonant circuit. In the steady state, the controlled gain amplifier need produce only the ohmic voltage drop.

The gradient strength of the read-out gradient $G_x$ is controlled by the controlled gain amplifier at every point in time. This is particularly true of the transient range $\tau_1$, which is important herein. The stored energy of the capacitive and inductive circuit elements must first be supplied by the controlled gain amplifier. The cosine-shaped curve of the read-out gradient $G_x(t)$ is thus preceded by a transient effect in the transient range $\tau_1$, in which an NMR signal is not yet measured. This transient range $\tau_1$ is chronologically limited, so that the NMR signal is not substantially attenuated by transverse relaxation and by inhomogeneities of the main magnetic field.

DESCRIPTION OF THE PREFERRED EMBODIMENTS

Figure 1:
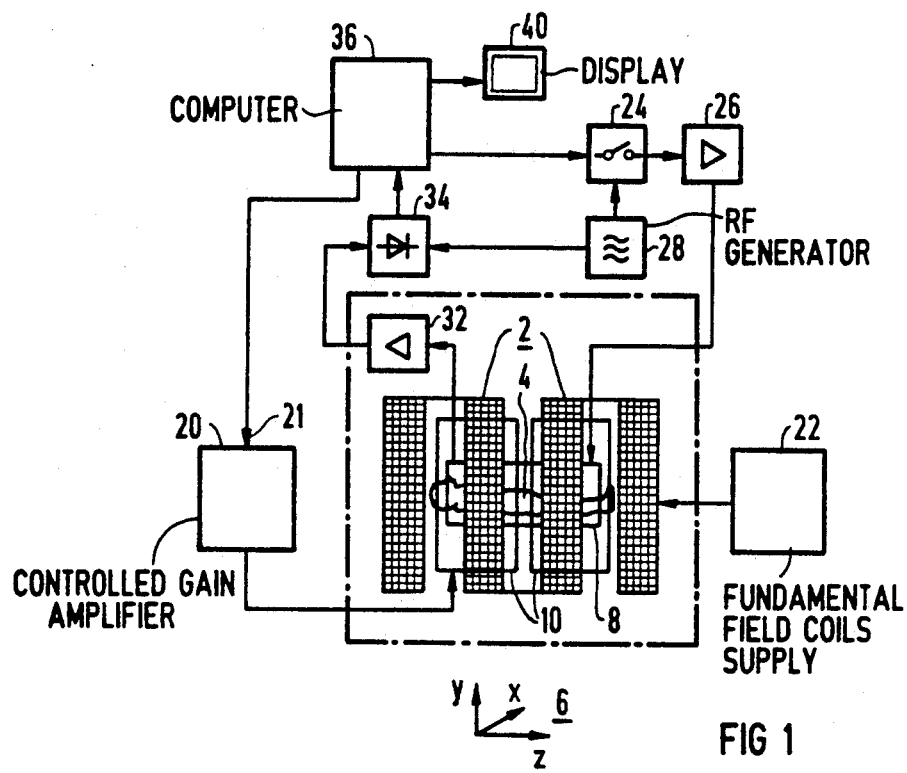
FIG. 1 is a schematic block diagram of a magnetic resonance imaging apparatus constructed and operating in accordance with the principles of the present invention.

A magnetic resonance imaging (MRI, or NMR) tomography apparatus constructed in accordance with the principles of the present invention is shown in FIG. 1. The apparatus includes a main magnetic field coils 2, which generate a main magnetic field $B_0$ in the direction of x-axis of a Cartesian coordinate system 6. An examination subject 4, such as a human body, is moved into this main magnetic field. A gradient coil system is provided, which includes three sets of gradient coils for respectively producing orthogonal magnetic field gradients in the x-, y- and z-directions. For clarity, only the gradient coil set 10 is shown, which produces a read-out gradient $G_x$. The gradient coil set 10, for example, may consist of at least two sub-coils respectively disposed parallel to each other on opposite sides of the examination subject 4. Gradient coils (not shown) for a phase coding gradient $G_y$ are disposed parallel to each other above and below the examination subject 4, and gradient coils for a slice selection gradient $G_z$ are disposed transversely relative to the examination subject 4, parallel to each other at the head and feet thereof.

Power is supplied to the gradient coil set 10 via a controlled gain amplifier 20. Power is supplied to the fundamental field coils 2 by a main field power supply 22.

The apparatus also includes an RF coil 8, which serves the purposes of exciting nuclear spins in the examination subject 4, and acquiring the resulting NMR signals. The RF coil 8 is driven via a transmission amplifier 26 and a modulator 24. The received NMR signals are forwarded from the RF coil 8 via a signal amplifier 32 and a phase controlled rectifier 34 to a computer 36, which is connected to a display 40. The computer 36 simultaneously serves to control operation of the gradient coil 10 via the controlled gain amplifier 20 and to control driving of the RF coil 8 via the modulator 24. A RF oscillator 28 is provided, which generates the RF signals to be transmitted by the RF coil 8 when the modulator 24 is closed, and which also controls the rectifier 34.

After the main field coils 2 are activated by the power supply 22, excitation of a slice of the examination subject 4 is undertaken with a selective 90° RF pulse, with z=constant. For this purpose, a slice selection gradient $G_z$ is activated according to a predetermined time function. At the same time, an RF pulse is generated having a frequency dependent on the position of the selected slice. Gradient current pulses for the read-out gradient $G_x$ and for the phase coding gradient $G_y$ follow. An echo of the nuclear magnetic resonance signal arises in the measuring range of the read-out gradient $G_x$. This echo is sensed and read out using the RF electronics. When a complete data set has been acquired, this is subjected to a two-dimensional Fourier transformation in the computer 36, and the resulting image is forwarded to the display 20, where it is visually displayed.

Figure 2:
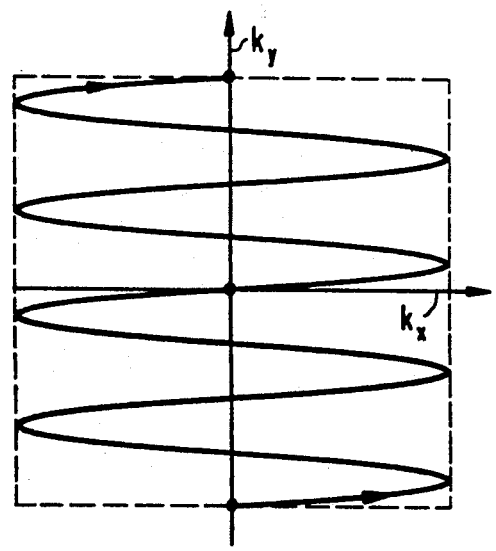
FIGS. 2 and 3 are respective diagrams for explaining the acquisition of the NMR signals in the wave number plane.
Figure 3:
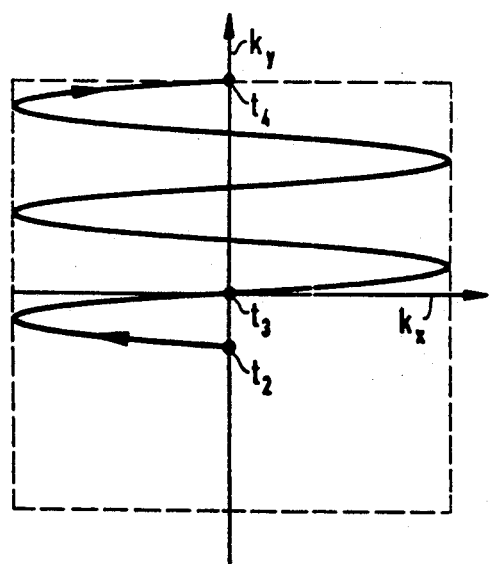

All of the image information can be acquired in only one elementary pulse sequence, i.e., after only one excitation of the nuclear spins. For this purpose, the entire wave number plane $$[k_x, k_y]$$

of the real image must be swept (traversed) with z=0 in the slice of the x-y plane selected by the slice selection gradient $G_z$, as schematically shown in FIG. 2, in which the wave number $k_y$ is entered on the ordinate, and the wave number $k_x$ is entered on abscissa. In practice, however, it is preferred to conform to the schematic illustration of FIG. 3, so that a strip around $k_y=0$ is measured with both operational signs of $k_x$, to acquire information about the phase response of the RF coil 8. FIGS. 4 through 7 show the schematic pulse sequence corresponding thereto.

When measured values are present on a sinusoidal path covering the wave number plane, one can interpolate therefrom to a Cartesian, equidistant covering with measured points, and the two dimensional Fourier transformation into the locus image can be made.

For the wave numbers $k_x$ and $k_y$, the desired wave number function is:

$$k_y(t) = K_y \cdot \frac{(t - t_3)}{\tau_4}$$

$$k_x(t) = K_x \cdot \sin\omega(t - t_3)$$

whereby the maximum wave numbers $K_x$ and $K_y$ are derived from the desired spatial resolution, or pixel dimension $\Delta x$, $\Delta y$ as follows:

$$K = \frac{\pi}{\Delta x} \quad K_y = \frac{\pi}{\Delta y}.$$

The frequency $\omega$ is derived from the plurality $N_y$ of desired image lines. Since two Fourier lines are measured per full sine oscillation, $N_y/2$ full oscillations are needed, according to FIG. 2, in the full Fourier embodiment, and slightly more than $N_y/4$ full oscillations are needed in the half-Fourier modification of FIG. 3. Given a range of measurement $\tau_2$, which corresponds to the exposure time in photography, this results in frequencies $$\omega = 2\pi \cdot N_y/2\tau_4 \text{ or}$$

$$\omega = 2\pi \cdot N_y/4\tau_4.$$

The wave numbers $k_x$, $k_y$ having nuclear spin density $\rho(x, y)$ and a nuclear magnetization M in the rotating reference system $$\rightarrow M(x,y) \sim \rho(x,y) \exp\{jk_x x\} \exp\{jk_y y\}$$

can be guaranteed with a wave number $k_y$ by gradient fields:

$$\gamma G_1(t) = \frac{\partial k_i}{\partial t}$$

in the echo planar imaging (EPI) method. Therefore:

$$G_y(t) = \gamma^{-1} \cdot \frac{K_y}{\tau_4} \text{ and}$$

$$G_x(t) = \gamma^{-1} K_x \omega \cos\omega(t - t_3) = G_x \cos\omega(t - t_3)$$

The gradient strength $G_x(t)$ is proportional to the current $I_x(t)$ flowing in the gradient coils:

$G_x(t) = g \cdot I_x(t)$ wherein g is a factor which is dependent on the geometry and the number of turns of the coil. The amplitude is therefore:

$$G_x = g \cdot I_x.$$

For a pixel dimension of, for example, $\Delta x = \Delta y = 2.4$ mm and an exposure time $\tau_2 = 51$ msec, the above equations result in an operating frequency $\omega$ of $2\pi \cdot 1.25$ kHz, and a gradient amplitude $G_x = 40$ mT/m. Such values cannot be achieved with standard coils and amplifiers of conventional magnetic resonance imaging systems. For coils that surround the body to allow exposures of the human heart, the coils would have to be supplied with power of about 500 MW.

Figure 4:
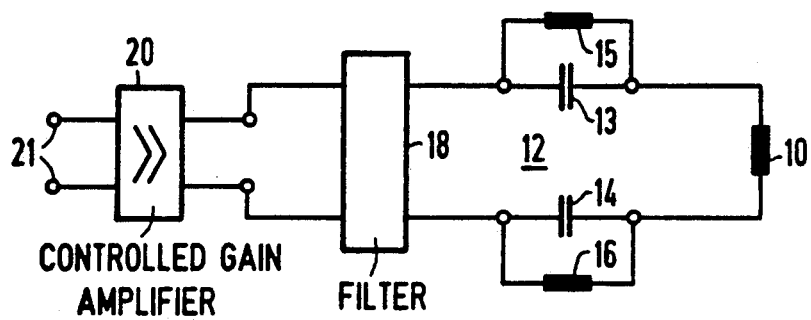
FIG. 4 is schematic block diagram of a power supply for the gradient coil for the read-out gradient in the apparatus of FIG. 1, in accordance with the principles of the present invention.

In order to avoid this practical limitation, therefore, the gradient coil 10 for the read-out gradient $G_x$ of FIG. 4, in accordance with the principles of the present invention, is connected to a controlled gain amplifier 20 which is operated as a current regulator. The gradient coil 10 is connected thereto via a series resonant circuit having a capacitance C, which is preferably formed by two capacitors 13 and 14, each having a capacitance 2C. The gain of the amplifier 20 is controlled at a control input 21 by the computer 36 such that the power curve in the transient range, and at the beginning of the measurement range, is steady and the wave number $k_x$ is zero at the time $t_2$, which begins the measurement range $\tau_2$. A power supply unit which delivers a voltage of a few hundred volts and a current of a few hundred amperes, which is standard in nuclear resonance tomography, can be used as the controlled gain amplifier 20.

The controlled gain amplifier 20 supplies a gradient current I for the gradient coil 10 which is independent of the coil resistance and is also independent of the ratio of the inductance of the coil 10 to the real load. In one embodiment of the invention, the controlled gain amplifier 20 may a switched controlled gain amplifier. A low-pass filter 18 which allows the low frequencies, for example below 10 kHz, to pass and which blocks high frequencies, for example above 1 MHz, is preferably provided between the gradient coil 10 and the controlled gain amplifier 20. This low-pass filter thus shields against RF radiation which can disturb operation of the RF coil 8, and only allows the gradient current I to pass. In the embodiment of FIG. 4 having divided capacitances, the operating voltage of, for example 4 kV, is divided between the two capacitors 13 and 14, and thus simultaneous results in a voltage reduction to ground at the gradient coil 10. The gradient coil 10 is preferably a single cabled conductor. In this embodiment, only a slight skin effect, and thus a correspondingly low rise in resistance, occurs at higher frequencies.

In a preferred embodiment, a choke is connected in parallel with the capacitance of the series resonant circuit. In the embodiment of FIG. 4, therefore, respective choke 15 and 16 are connected in parallel with the capacitors 13 and 14. The chokes 15 and 16 conduct the unavoidable d.c. offset of the controlled gain amplifier 20 of, for example, about 0.5 mA, past the capacitors 13 and 14 in the parallel branches, so that the capacitors 13 and 14 cannot be charged by the offset current. The chokes 15 and 16 are ineffective at the operating current, which has a frequency of, for example, 1 kHz. The d.c. path which has arisen in this manner allows a predetermined DC current to be impressed on the read-out gradient, in order to generate linear field gradients which are intended to compensate inhomogeneities of the first order in the main field.

Figure 5:
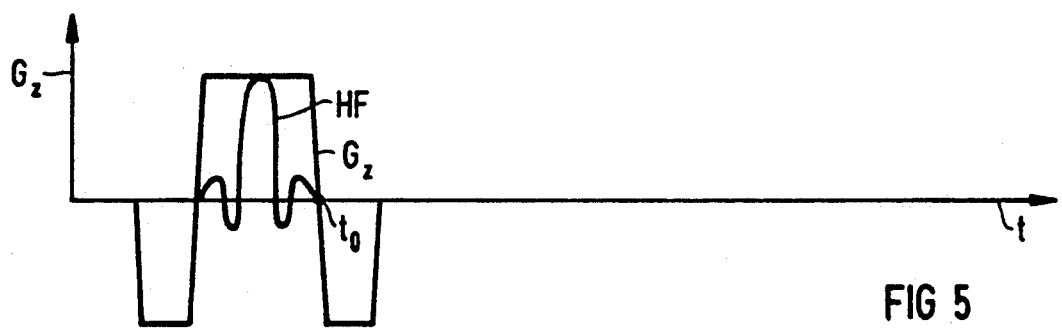
FIG. 5 is a graph showing the chronological curve of the slice selection gradient used in the operation of the apparatus of FIG. 1.
Figure 6:
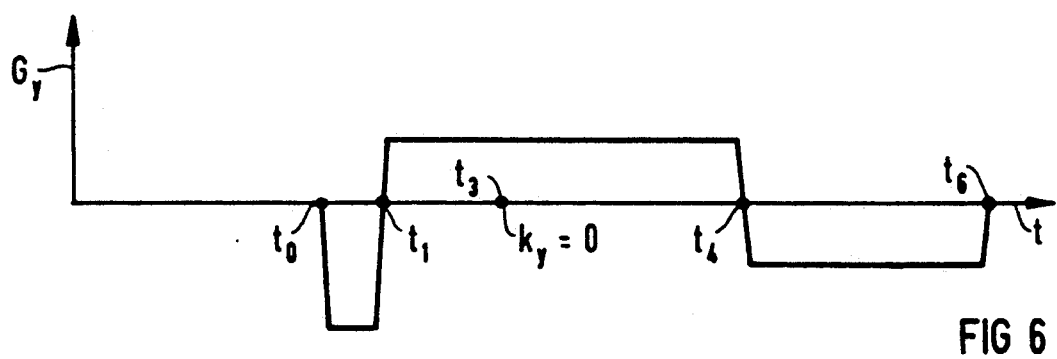
FIG. 6 is a graph showing the chronological curve of the phase coding gradient used in the operation of the apparatus of FIG. 1.
Figure 7:
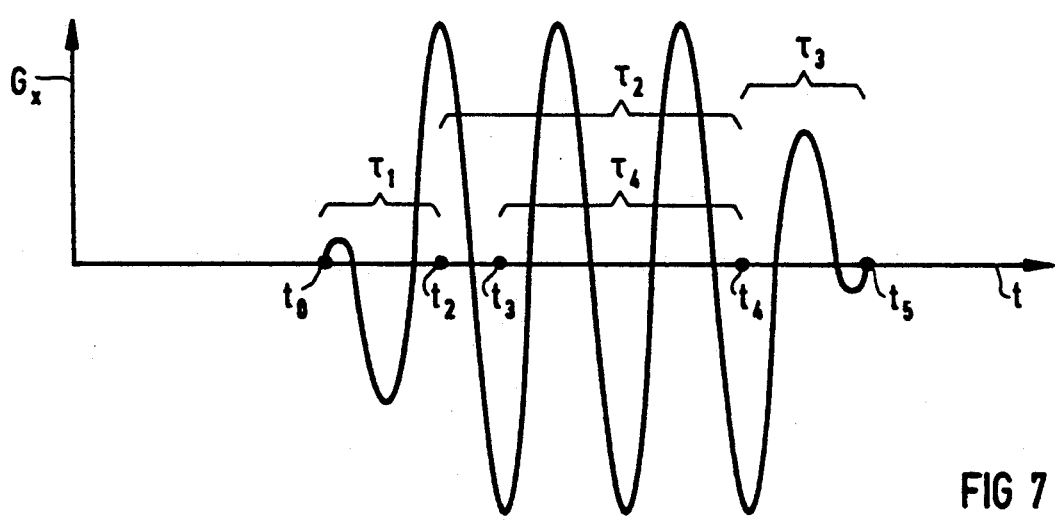
FIG. 7 is a graph showing the chronological curve of the read-out gradient used in the operation of the apparatus of FIG. 1.
Figure 8:
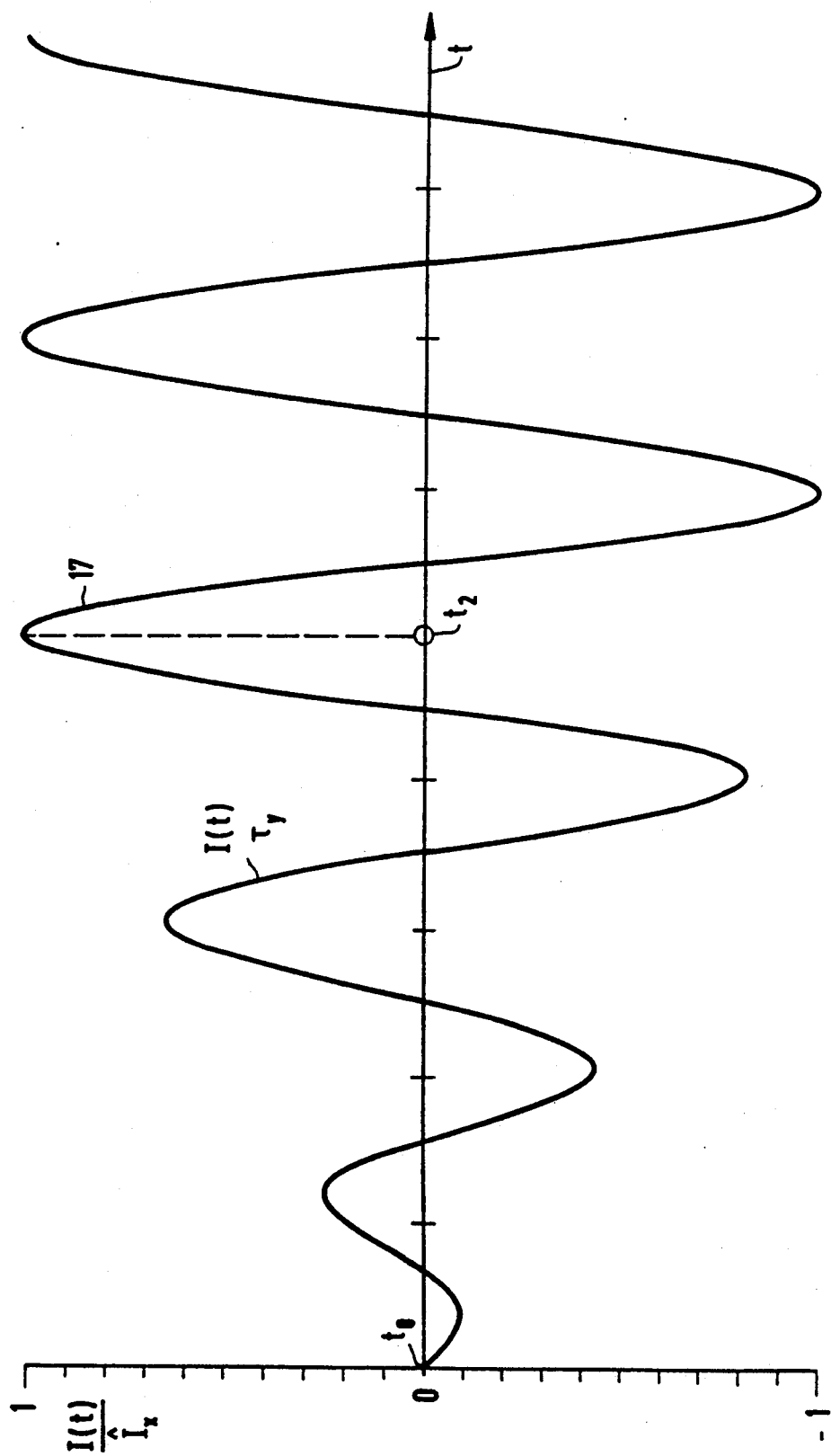
FIG. 8 is a graph showing the measured curve of the current I(t) obtained in the apparatus of FIG. 1.

As shown in FIG. 5, wherein a slice selection gradient $G_z$ is entered with respect to time t, the slice selection gradient $G_z$ is generated at an arbitrarily selectable time, not specifically referenced in FIG. 5. At the same time, the RF coil 8 is supplied with a RF pulse RF, and thus a selected slice is excited. As shown in FIG. 6, a phase coding gradient $G_y$ is also activated at time $t_0$. The phase coding gradient $G_y$ defines the measurement range $\tau_2$ for data acquisition, from $t_2$ through $t_4$. In accordance with the principles of the present invention, a transient range $\tau_1$ from $t_0$ through $t_2$ precedes the measurement range $\tau_2$, as shown in FIG. 7 wherein the read-out gradient $G_x$ is entered over time t. The curve of the read-out gradient $G_x$ in the transient range $\tau_1$ meets the condition that the gradient current be steady at the beginning of the measurement range at time $t_2$, and thus the gradient current must also be steady in the transient range $\tau_1$, because the gradient current I cannot discontinuously increase to the maximum amplitude at time $t_2$.

In the transient range $\tau_1$, the reactive energy capacitatively and/or inductively stored in the resonant circuit must first be supplied by the controlled gain amplifier 20. A transient effect, in the time $t_0$ through $t_2$ in which an NMR signal is not yet being measured, therefore precedes the cosinelike curve of the read-out gradient $G_x$. A pulse sequence for the half-Fourier modification of FIG. 3 thus has the curve as shown in FIG. 7.

The transient range $\tau_1$ is maintained short so that the NMR signal is not significantly attenuated by transverse relaxation and by inhomogeneities in the main field. The controlled gain amplifier 20 is characterized by its maximum current $I_{max}$ and its maximum voltage $U_{max}$ at its output terminals. Neither of these maxima should be exceeded. In order to optimally exploit the gain of the controlled gain amplifier 20, the voltage peaks during the transient range $\tau_1$ should result in a control reserve $\epsilon \approx 0.1$ at $U_{max}$. The output voltage U(t) will thus follow the curve below, and will also observe the relationship below:

$$U(t) = H(t) \cdot \hat{U} \sin\{\omega t + \rho_0\} \leq (1-\epsilon)U_{max}.$$

wherein H(t) is the Heaviside unit function.

Moreover, the current curve I(t) must begin steadily proceeding from I=0, and must also change steadily into the steady state having an amplitude $I_x$ at time $t_2$. Further, only solutions wherein the wave number $k_x$ is just zero at this time $t_2$, which begins the acquisition of measured values, are usable. These requirements are embodied in the following equation:

$$k_x(t_2) = g \cdot \gamma \int_{t_0}^{t_2} I(t)dt = 0.$$

The optimum transient function I($t_0$ through $t_2$) with which the controlled gain amplifier 20 must be driven, is therefore:

$$I(t_0 \leq t \leq t_2) = \omega_1^{-1} I_x \{q_0 \cos\omega t' + a\omega\sin\omega t' +$$
$$e^{-\alpha t'}[\alpha(-a\cos\omega_1 t' - \omega_1\sin\omega_1 t' + b(a\sin\omega_1 t' + \omega\cos\omega_1 t')]\}$$

with $t' = t - t_0$. The controlled gain amplifier 20 may be driven via one or more digital-to-analog converters, which have been omitted from FIG. 1 for clarity.

Operating the controlled gain amplifier 20 with a current as described above results in a curve for the voltage having a constant envelope defined as follows:

$$U(t_0 \leq t \leq t_2) =$$
$$\omega_1^{-1} J_x C \left\{ \sin\omega t' \left[ \frac{q_0(1-\omega^2 LC) + a\omega^2 RC}{\omega} \right] - \right.$$
$$\left. \cos\omega t'[a(1-\omega^2 LC) - q_0 RC] \right\}$$

In the voltage equation, the gradient frequency $\omega$ is known and the other quantities (R = the aggregate of all resistances in the resonant circuit, C = resonant circuit capacitance, and L = radient coil inductance) are measured. In the above equation, $\alpha = R/(2L)$ and $\omega_1 = (1/(LC) - \alpha^2)^{\frac{1}{2}}$, which is the resonant frequency.

The as yet unknown quantities $q_e$, a, and b are derived from the following requirements:

1) The gradient current is zero at the beginning of the transient range; at time $\tau_1$ at time $t_0$, i.e.

$$I(t_0) = 0 \rightarrow q_0 - a\alpha + \omega_1 b = 0.$$

2) The wave number $k_x$ must be zero at the end of the transient range $\tau_1$ at time $t_2$, i.e.

$$\int_{t_0}^{t_2} I(\tau)d\tau = 0 \rightarrow \omega^{-1}q_0\sin\omega\tau_1 + a\{-\cos\omega\tau_1 + e_1^{\alpha\tau}\cos\omega_1\tau_1\} +$$
$$b \cdot e_1^{-\alpha\tau}\sin\omega_1\tau_1 = 0$$

3) The gradient current must have reached its peak value at the start of the measurement range $\tau_2$ at time $t_2$, i.e.

$$I(t_2) = I_x \rightarrow$$
$$q_0\cos\omega\tau_1 + a\{\omega\sin\omega\tau_1 - e_1^{-\alpha\tau}[\alpha\cos\omega_1\tau_1 + \omega_1\sin\omega_1\tau_1]\} +$$
$$b \cdot e_1^{-\alpha\tau}[\alpha\sin\omega_1\tau_1 + \omega_1\cos\omega_1\tau_1] = \omega_1$$

The following solutions are derived from the above requirements:

$$a = \frac{\omega_1\left(\Psi_1 - \frac{\Phi_1}{\omega}\right)}{N}$$

$$b = \frac{\Psi_1\alpha - \Psi_2 + \Phi_2}{N}$$

$$q_0 = \frac{\omega_1\left(\Psi_2 - \Phi_2 - \alpha\frac{\Phi_1}{\omega_1}\right)}{N}$$

with the following abbreviations:

$$\Psi_1 = \frac{\sin\omega\tau_1}{\omega}$$

$$\Psi_2 = \cos\omega\tau_1$$

$$\Phi_1 = e_1^{-\alpha\tau}\sin\omega_1\tau_1$$

$$\Phi_2 = e_1^{-\alpha\tau}\cos\omega_1\tau_1$$

and $$N = \omega^2\Psi_1^2 -$$
$$\Psi_1\Phi_1\left(\omega_1 + \frac{\alpha^2}{\omega_1} + \frac{\omega^2}{\omega_1}\right) + \Phi_1^2 + (\Psi_2 - \Phi_2)^2.$$

Figure 10:
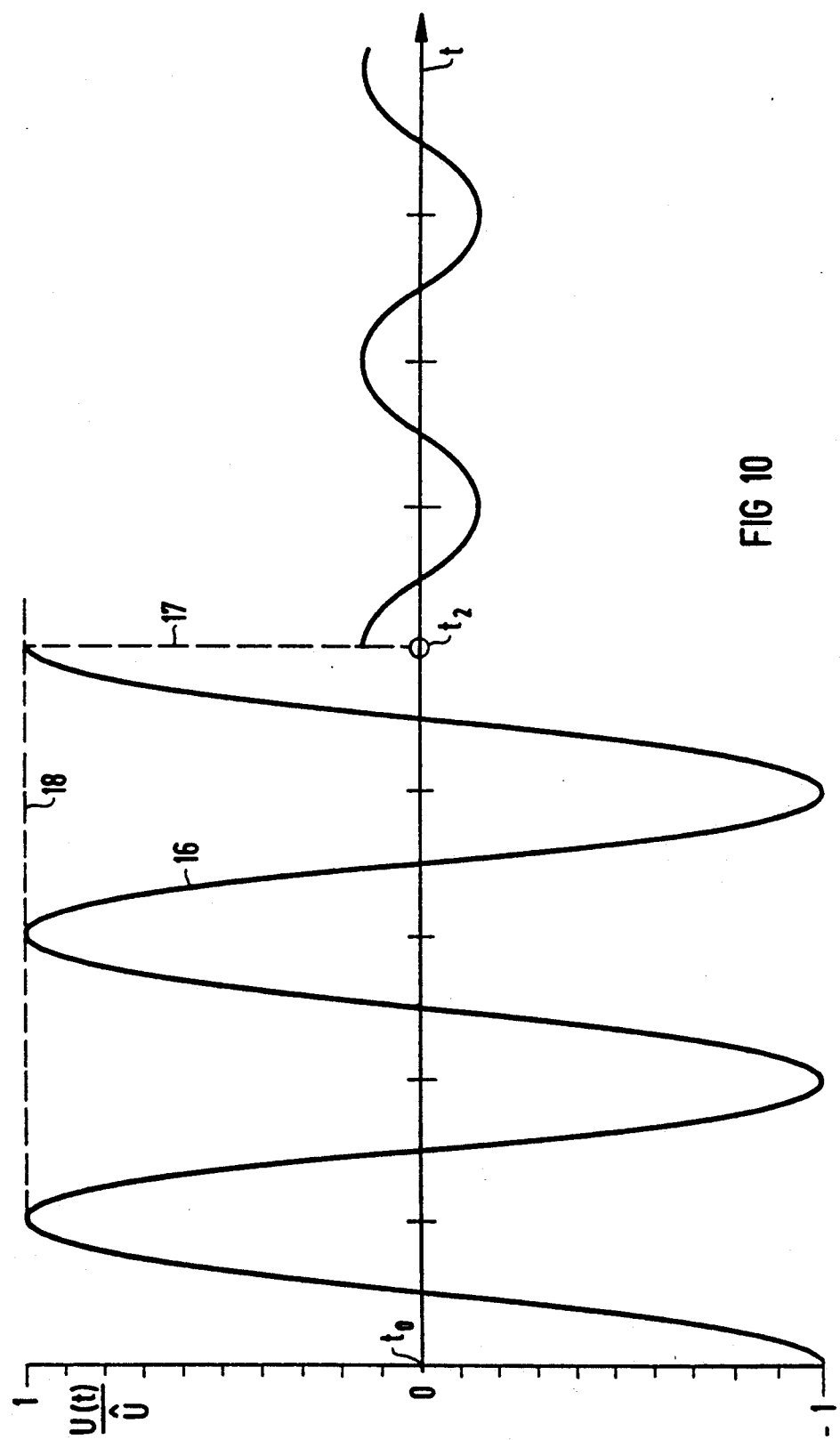
FIG. 10 is a graph showing the chronological curve of the normalized output voltage of the controlled gain amplifier of FIG. 4 during the operation of the apparatus shown in FIG. 1.

The associated peak voltage according to FIG. 10 is:

$$U = \frac{I_x}{\omega_1 C}\left\{[1 - \omega^2 LC)^2 + (\omega RC)^2] \cdot \left[\frac{q_0^2}{\omega^2} + a^2\right]\right\}^{\frac{1}{2}}$$

The values for R, C, L and thus, $\alpha$ and $\omega_1$, are measured first. The duration of the transient range $\tau_1$ is selected between $t_0$ through $t_2$, preferably in multiples n of one-half the oscillation duration, i.e.:

$$\omega\tau_1 = n\pi$$

Since the measured values will be affected by measuring errors or component drift, precise resonance balancing is generally not possible and so the following approximations are valid:

$\omega_1 \approx \omega$ and $\omega_1 \tau_1 \approx n\tau$

For the special case $\omega = \omega_1$, i.e. given exact tuning of the resonance circuit, the solutions for a, b, $q_o$ are significantly simplified. In this special case, $\Psi_1 = 1; \Psi_2 = (-1)^n$ $\Phi_1 \approx 0; \Phi_2 \approx (-1)^n$.

After calculation of the parameters a, b, $q_o$ for the selected transient range duration, a check is undertaken to determine whether the peak voltage $\hat{U}$ according to FIG. 10 can be entered over the time t. The current rises steadily in the transient range from $t_0$ through $t_2$, and reaches its maximum amplitude at time $t_2$ at the beginning of the measurement range. This transient effect is calculated by the computer 36, and the generation of the input signal 21 is switched to stationary operation at the end of the transient range at time $t_2$.

Figure 9:
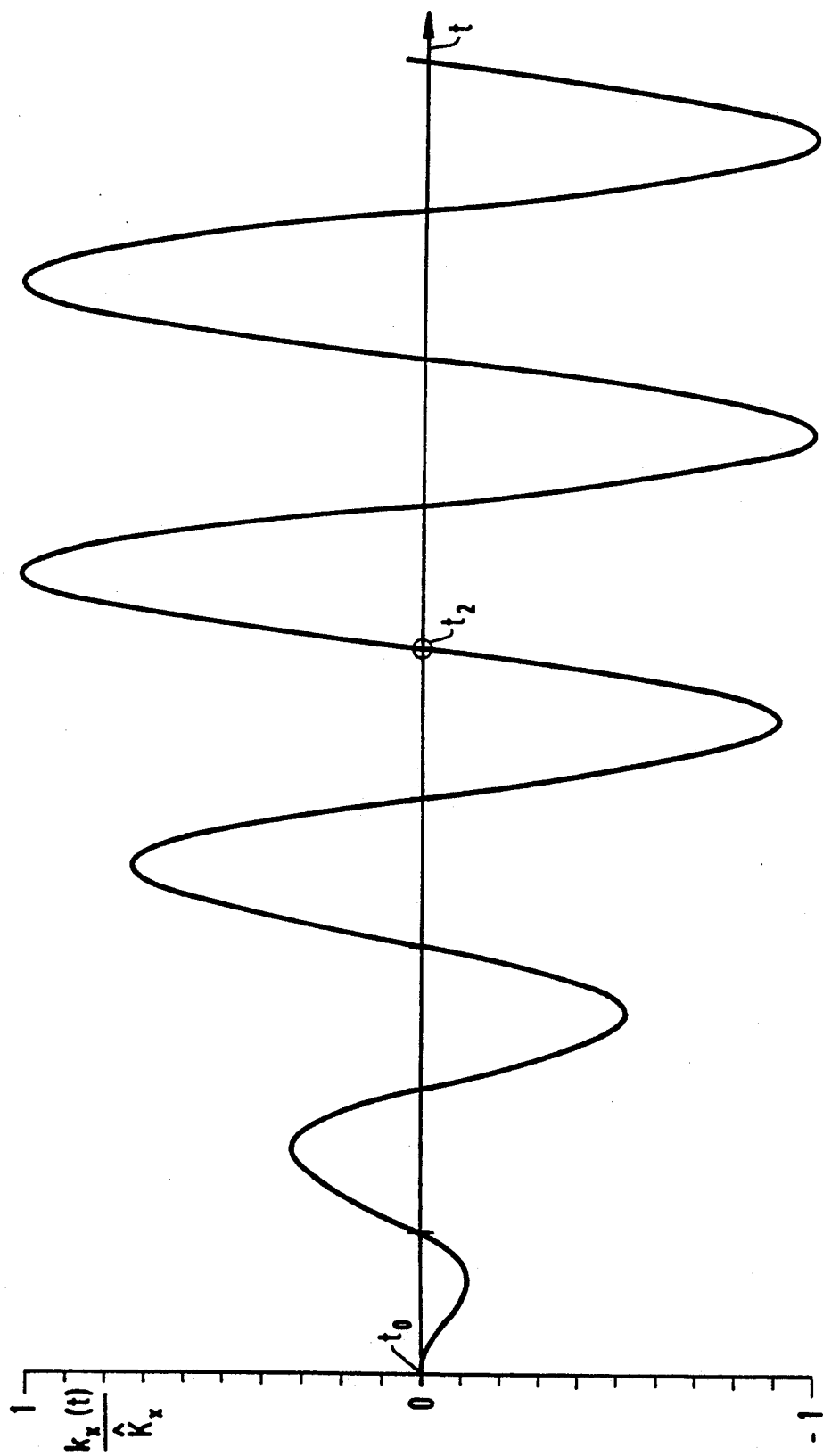
FIG. 9 is a graph showing the wave number in the operation of the apparatus shown in FIG. 1.

The curve of the wave number $k_x$ as a function of the time t is illustrated in FIG. 9, wherein the wave number $k_x$ normalized to the amplitude $K_x$ is entered over time t. The wave number $k_x$ is zero at the end of the transient range at time $t_2$.

The curve for the voltage $\hat{U}$ is shown in FIG. 10, in which the output voltage $\hat{U}$ of the controlled gain amplifier 20 normalized to the amplitude $\hat{U}$ is entered over the time t. The voltage amplitude $\hat{U}$ must remain lower than the maximum voltage of the amplifier 20, so that saturation is avoided. At the end of the transient range $\tau_1$ at time $t_2$, the voltage returns to a significantly lower value, which is not specifically shown in FIG. 10, which covers the voltage requirement of the power circuit for ohmic losses.

Figure 11:
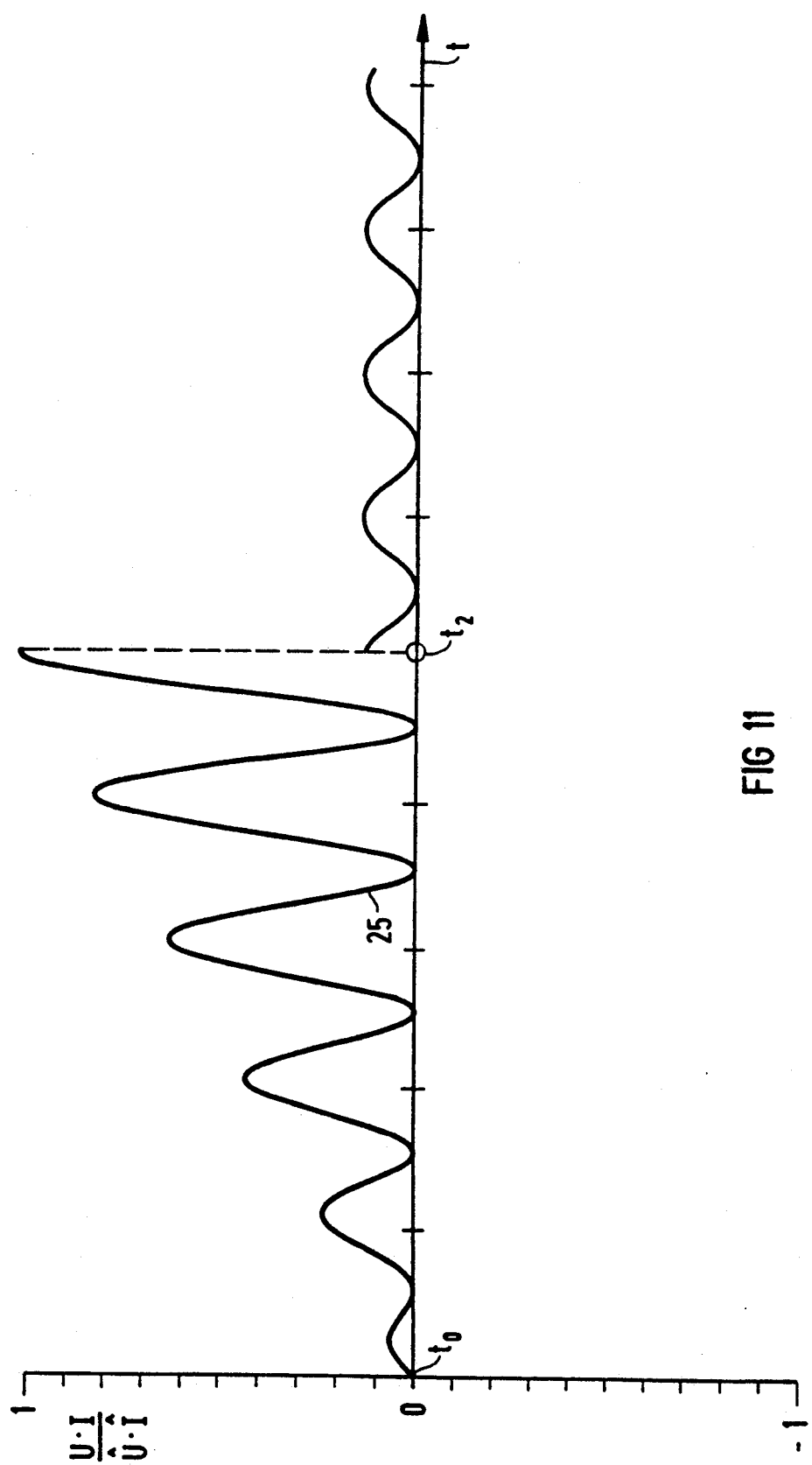
FIG. 11 is a graph showing the chronological course of the normalized output power of the controlled gain amplifier shown in FIG. 4 during the operation of the apparatus of FIG. 1.

The curve of the power P(t) of the amplifier 20 for a transient range $\tau_1$ of, for example, n = 5 is shown in FIG. 11. The power shown in FIG. 11 is essentially positive, and thus consists only of effective (non-reactive) power. Negative (reactive) contributions to the power in the measurement range $\tau_2$ which must also be handled by the controlled gain amplifier 20, arise if the resonant circuit is not exactly tuned.

As noted above, the controlled gain amplifier 20 can be a switched controlled gain amplifier. The switching frequency $\omega_s$, however, must be selected significantly higher than the gradient frequency $\omega$. The series resonant circuit is then inductive for $\omega_s$, and serves as the necessary inductive energy storage means.

In precision when measuring the resistance R, the inductance L and the capacitance C have the result that the peak $\hat{U}$ is not exactly known. This is compensated by the control reserve $\epsilon$. Because the amplifier 20 is operated as a current regulator, the gradient current $I_x(t)$ precisely corresponds to the current supplied from the computer 36 via, for example, digital-to-analog convertors. The equation system for the quantities a, b $q_0$, which is internally consistent, assures that the required continuity conditions and boundary conditions as derived from the equations for the current I(t) are satisfied in all cases.

Because a series resonant circuit does not allow any additive, constant dc component which, in combination with the gradient coils, generates the linear field gradients for the correction of main field inhomogeneities, the capacitors 13 and 14 can be respectively bridged by the chokes 15 and 16. The inductance of the chokes 15 and 16 is selected extremely high in comparison with the inductances of the gradient coils. This inductance therefore does not disturb the resonant mode, but permits the amplifier 20 to supply a dc component to the gradient coil 10.

Following the stationary cosine oscillation of the read-out gradient $G_x$, the decay is also preferably current-controlled in a decay region $\tau_3$, from $t_4$ through $t_5$ as shown in FIG. 7. This control is undertaken even though the acquisition of the measured values has already been completed at the end of the measurement range $\tau_2$ at time $t_3$. This insures that no dangerous voltage peaks arise.

If the current curve in the decay region $\tau_3$ from $t_4$ through $t_5$ is "mirrored" with respect to time, i.e., $I(t - t_4) = \pm I(t_2 - t)$, the condition $$\int_{t_0}^{T_{rep}} G_x(t) dt = 0$$

is assured, whereby $T_{rep}$ is the point in time of the beginning of the next tomogram.

As shown in FIGS. 5 and 6, the curve of the slice selection gradient $G_z(t)$ and of the phase coding gradient $G_y(t)$ can be shaped such that all gradient intervals are zero at the conclusion of the overall pulse sequence. This minimizes the harmful influences of eddy currents in electrically conductive coil and magnet structures.

As will be understood by those skilled in the art, the respective roles of the x-, y-, z-gradient coils can be interchanged to obtain a plano-section other than the z-plane which has been used herein for the purpose of exemplary explanation.

Other modifications and changes may be apparent to those skilled in the art, however, it is the intention of the inventors to embody within the patent warranted hereon all changes and modifications as reasonably and properly come within the scope of their contribution to the art.

We claim as our invention:

1. A magnetic resonance imaging tomography apparatus operable according to the echo planar imaging method comprising:

means for generating a main magnetic field in which an examination subject is disposed;

a plurality of gradient coils for respectively generating gradient magnetic fields;

radio frequency means for generating radio frequency signals for inducing nuclear magnetic spins in said examination subject and for acquiring nuclear magnetic resonance signals from said examination subject;

means for operating said gradient coils and said radio frequency means according to said echo planar imaging method to obtain a data set of said nuclear magnetic resonance signals corresponding to a selected slice of said examination subject;

a capacitance connected to at least one of said gradient coils, said one of said gradient coils having an inductance which, in combination with said capacitance, forms a series resonant circuit;

said means for operating said gradient coils including a controlled gain amplifier means operated as a current regulator for regulating current supplied to said one of said gradient coils for generating a read-out gradient magnetic field, having a wave number associated therewith, so that said read-out gradient magnetic field is steady in a transient region immediately preceding a measurement region in which read-out of said nuclear magnetic resonance signals takes place and so that said wave number at the beginning of the measurement region is zero.

2. An apparatus as claimed in claim 1 wherein said capacitance is formed by two capacitors connected symmetrically relative to said one gradient coil.

3. An apparatus as claimed in claim 2 further comprising two chokes respectively connected in parallel with each of said capacitors.

4. An apparatus as claimed in claim 1 wherein said controlled gain amplifier is a switched controlled gain amplifier.

5. A method for improved operating of a magnetic resonance imaging apparatus employing the echo planar imaging method comprising the steps of;
obtaining an image of an examination subject in a magnetic resonance imaging tomography apparatus according to said echo planar imaging method, including the step of supplying a coil with a gradient current for generating a read-out gradient magnetic field having a cosine-shaped read-out gradient curve in a measurement region in which nuclear magnetic resonance signals are read out from an examination subject; and
controlling the gradient current in said coil which generates said read-out gradient magnetic field so that said gradient current is steady in a controlled transient region immediately preceding said measurement region and so that said gradient current has a wave number which is zero at the end of said transient region.

6. A method according to claim 5 wherein step of controlling said gradient current is further defined by controlling said gradient current using a controlled gain amplifier connected to a series resonant circuit having a capacitance C and an inductance L and a resonant frequency $\omega_1$, and wherein said transient region $\tau_1$ occurs between times $t_0$ and $t_2$, and wherein said gradient current in said transient region $\tau_1$ is defined as $$I(t_0 \le t \le t_2) = \omega_1^{-1} I_x \{\varphi_0 \cos\omega t' + a\omega\sin\omega t' +$$

-continued $$e^{-at'}[a(-a\cos\omega_1 t' - \omega_1\sin\omega_1 t' + b(a\sin\omega_1 t' + \omega\cos\omega_1 t')]\}$$

wherein $t' = t - t_0$, $a = R/2L$, $\omega_1 = (1/(LC) - a^2)^{\frac{1}{2}}$, $$a = \frac{\omega_1\left(\Psi_1 - \frac{\Phi_1}{\omega}\right)}{N}$$

$$b = \frac{\Psi_1 a - \Psi_2 + \Phi_2}{N}$$

$$\varphi_0 = \frac{\omega_1\left(\Psi_2 - \Phi_2 - a\frac{\Phi_1}{\omega_1}\right)}{N}$$

$$\Psi_1 = \frac{\sin\omega\tau_1}{\omega}$$

$$\Psi_2 = \cos\omega\tau_1$$

$$\Phi_1 = e_1^{-a\tau}\sin\omega_1\tau_1$$

$$\Phi_2 = e_1^{-a\tau}\cos\omega_1\tau_1$$

$$N = \omega^2\Psi_1^2 -$$

$$\Psi_1\Phi_1\left(\omega_1 + \frac{a^2}{\omega_1} + \frac{\omega^2}{\omega_1}\right) + \Phi_1^2 + (\Psi_2 - \Phi_2)^2.$$

7. A method as claimed in claim 5, including the step of:
generating a slice selection gradient having positive and negative pulses so that the time integral of said slice selection gradient is zero.

8. A method as claimed in claim 5 including the step generating a phase coding gradient consisting of positive and negative pulses so that the time integral of said phase coding gradient is zero.

9. A method as claimed in claim 5 wherein the step of generating a read-out gradient magnetic field is further defined by generating a read-out gradient magnetic field having a decay region following said measurement region wherein said read-out gradient curve follows an inverse chronological curve relative to its chronological curve during said transient region, so that the time integral of said read-out gradient curve is zero.

* * * * *